United States Patent
Choi et al.

(10) Patent No.: US 6,759,339 B1
(45) Date of Patent: Jul. 6, 2004

(54) METHOD FOR PLASMA ETCHING A MICROELECTRONIC TOPOGRAPHY USING A PULSE BIAS POWER

(75) Inventors: Chang Ju Choi, Fremont, CA (US); Benjamin Schwarz, Santa Clara, CA (US)

(73) Assignee: Silicon Magnetic Systems, San Jose, CA (US)

(*) Notice: Subject to any disclaimer, the term of this patent is extended or adjusted under 35 U.S.C. 154(b) by 0 days.

(21) Appl. No.: 10/319,318

(22) Filed: Dec. 13, 2002

(51) Int. Cl.⁷ .......................................... H01L 21/302

(52) U.S. Cl. ........................................ 438/710; 438/714

(58) Field of Search ............................. 438/706, 710, 438/714

(56) References Cited

U.S. PATENT DOCUMENTS

| | | | | |
|---|---|---|---|---|
| 5,614,060 A | | 3/1997 | Hanawa | 438/220 |
| 6,010,603 A | | 1/2000 | Ye et al. | 204/192.35 |
| 6,093,332 A | * | 7/2000 | Winniczek et al. | 216/2 |
| 6,103,636 A | * | 8/2000 | Zahorik et al. | 438/745 |
| 6,315,913 B1 | * | 11/2001 | Engelhardt et al. | 216/13 |
| 6,391,659 B1 | | 5/2002 | Kwon et al. | 438/3 |
| 6,395,641 B2 | | 5/2002 | Savas | 438/714 |
| 6,611,453 B2 | * | 8/2003 | Ning | 365/171 |

OTHER PUBLICATIONS

Choi et al., "Duty Ratio Effects in $BCl_3/Cl_2$ Pulsed Plasmas for Metal Etching Processes," May 2000, 1 page.

Choi et al., "Negative Ion Formation in $SiO_2$ Etching Using a Pulsed Inductively Coupled Plasma," *Jpn. J. Appl. Phys.*, 37(12B), 1998, pp. 6894–6898.

Kwon et al., "Control of Performance Degredation Induced by Contact Etching for a Ferroelectric Capacitor Using a Pulsed–Power Inductively Coupled Plasma," *4th International Symposium on Plasma Process–Induced Damage*, May 1999, pp. 145–148.

* cited by examiner

*Primary Examiner*—T. N. Quach
(74) *Attorney, Agent, or Firm*—Kevin L. Daffer; Mollie E. Lettung; Conley Rose P.C.

(57) ABSTRACT

A method is provided which includes pulsing power applied to a microelectronic topography between a high level and a low level during a plasma etch process. In particular, the high level may be sufficient to form etch byproducts at a faster rate than a rate of removal of the etch byproducts from the reaction chamber at the high level. In contrast, the low level may be sufficient to form etch byproducts at a rate that is less than a rate of removal of the etch byproducts at the low level. In this manner, an etched topography may be formed without an accumulation of residue upon its periphery. Such a method may be particularly beneficial in an embodiment in which the etch byproducts include a plurality of nonvolatile compounds, such as in the fabrication of a magnetic junction of an MRAM device, for example.

21 Claims, 1 Drawing Sheet

METHOD FOR PLASMA ETCHING A MICROELECTRONIC TOPOGRAPHY USING A PULSE BIAS POWER

BACKGROUND OF THE INVENTION

1. Field of the Invention

This invention relates to the fabrication of microelectronic devices and, more particularly, to a method for etching a microelectronic topography.

2. Description of the Related Art

The following descriptions and examples are given as background information only.

Plasma etch techniques are often used in the fabrication of microelectronic devices to remove material in a relatively efficient manner. In some cases, the etch rate of plasma processes may be regulated by the application of a bias power coupled to the microelectronic topography. More specifically, power applied to the microelectronic topography may be used to increase the energy of ions residing within a plasma sheath formed between the plasma and the microelectronic topography. In general, an increase in ion energy will cause the ions to bombard the microelectronic topography with more force and at a faster rate, increasing the etch rate of the process. In addition, the power applied to the microelectronic topography may be used to regulate the directionality of the ions within the plasma sheath. In particular, the power applied to the microelectronic topography may bias the ions of the plasma to be projected in a substantially perpendicular direction with respect to the microelectronic topography. In this manner, a plasma etch process may be adapted to produce such an anisotropic etch profile by applying a bias power to the microelectronic topography.

In some cases, however, plasma etch techniques may generate a residue along the periphery of the etched topography. Such a residue may include compounds formed from the reaction of the plasma with the microelectronic topography. Consequently, the composition of the residue may depend on the etch chemistry and the material etched from the microelectronic topography. For example, the residue may include chlorinated, hydrogenated, fluorinated, or oxygenated compounds including silicon or metal molecules. In cases in which a photoresist layer is used to pattern the microelectronic topography, the residue may further include carbon.

In any case, the generation of residue may be particularly prevalent in etching processes which form nonvolatile compounds. In particular, nonvolatile compounds may be less likely to be removed from a reaction chamber due to the relatively low volatility. Consequently, nonvolatile compounds may be more likely to accumulate upon surfaces of a microelectronic topography during an etch process. In general, a nonvolatile compound, as used herein, may refer to a compound which has boiling point greater than approximately 300° C. at standard pressure. In some cases, the definition of a nonvolatile compound, as used herein, may be restricted to compounds which have a boiling point greater than approximately 900° C. at standard pressure. Examples of some nonvolatile compounds include, for instance, nickel chloride, cobalt chloride, iron chloride, and tungsten chloride. As such, the generation of residue may be particularly prevalent in etching processes which pattern microelectronic topographies which include nickel, cobalt, iron, and/or tungsten metals, since chlorinated gases are commonly used in plasma etch processes. For example, the generation of residue may be prevalent in the etching process of a magnetic junction of a magnetic random access memory (MRAM) device.

In any case, the residue formed during a plasma etch process may build up along the etched topography, reducing the anisotropic profile of patterned structures. Consequently, the accumulation of residue may cause a structure to be formed having dimensions outside the design specifications of the device. In cases in which the residue includes metal, the residue may further generate a condition sometimes referred to as veiling. In general, veiling may refer to the re-deposition of metal molecules along a periphery of an etched topography. Consequently, such a condition may, in some embodiments, cause metal layers spaced within an etched topography to short with each other, undesirably affecting the operation of a device formed therefrom. For example, veiling along a magnetic junction of an MRAM device may cause a short between magnetic layers of the magnetic junction, reducing the ability to determine the logic state of the junction.

One manner with which to remove residue along a periphery of an etched topography is to clean the topography with an acidic or basic chemistry subsequent to the etching process. Such a cleaning process, however, may also remove portions of the patterned microelectronic topography, altering the dimensions of the device from its design specifications. Such a change in the dimensions of the structure may be particularly undesirable in the fabrication of a magnetic junction of an MRAM device. In particular, cleaning a patterned magnetic junction with an acidic or basic chemistry to remove residue build-up may further reduce the dimensions of the magnetic junction, increasing the resistance of the junction. An increase in the resistance of a magnetic junction may undesirably decrease the tunneling magneto-resistance ratio (TMR) of the junction, reducing the reliability of the device.

Therefore, it may be advantageous to develop a method for etching a microelectronic topography which reduces or eliminates the generation of residue buildup along a periphery of the etched topography. In particular, it may be advantageous to develop a method which removes etch process byproducts during the etch process of a microelectronic topography. In this manner, a cleaning step using an acidic or basic chemistry may not be needed subsequent to the etch process for the fabrication of the device and, therefore, the dimensions of an etch topography may be maintained for the fabrication of a device therefrom.

SUMMARY OF THE INVENTION

The problems outlined above may be in large part addressed by a method for etching a microelectronic topography within a plasma reaction chamber. In particular, the method may include pulsing power applied to the microelectronic topography between a high level and a low level. In a preferred embodiment, the high level may be sufficient to form etch byproducts at a faster rate than a rate of removal of the etch byproducts from the plasma reaction chamber at the high level. In contrast, the low level is preferably sufficient to form etch byproducts at a rate that is less than a rate of removal of the etch byproducts at the low level. For example, in some cases, the high and low levels of the power applied to the microelectronic topography may include on and off states, respectively. Alternatively, the high and low levels of the power applied to the microelectronic topography may include different levels of an on state.

In either case, the high level may be a level sufficient to etch the microelectronic topography with a plasma generated within a reaction chamber including the microelectronic topography and the low level may be a level sufficient to stop etching the microelectronic topography with the plasma, in some embodiments. Alternatively, the low level may be sufficient to etch the microelectronic topography at a lower rate relative to the formation rate at the high level. In either case, the power applied to the microelectronic topography may be pulsed such that the strength of a plasma sheath between the plasma and the microelectronic topography may alternate between high and low levels of ion energy. For example, in some cases, the high level of power may be sufficient to generate an ion energy greater than approximately 150 eV, while the low level may be sufficient to generate an ion energy less than approximately 100 eV. Larger or smaller ion density values, however, may be induced by the high and low power levels, depending on the design specifications of the device. In any case, pulsing the power between the high and low levels may include a modulation frequency between approximately 10 Hz and approximately 100 KHz. In addition, the step of pulsing may include a duty ratio between approximately 10% and approximately 90%.

In any case, the etch byproducts formed during the method described herein may be removed from the chamber such that an etched topography may be formed without an accumulation of residue upon its upper surface. More specifically, the method may include reducing the power applied to the microelectronic topography to a level such that the etch byproducts formed at the high level of power may be removed from the reaction chamber during the etch process. Such a removal of etch byproducts may, in some embodiments, include removing the etch byproducts residing within the plasma and/or plasma sheath of the etch process. In this manner, reducing the level of the power applied to the microelectronic topography may prevent the re-deposition of the etch byproducts upon the topography and, therefore, may prevent an accumulation of etch byproducts upon the topography. In addition or alternatively, reducing the power may include removing an accumulation of the etch byproducts which have deposited upon the microelectronic topography.

In any case, the method described herein may be particularly beneficial in an embodiment in which the etch byproducts include a plurality of nonvolatile compounds. In particular, oscillating the power between high and low levels may be beneficial for allowing nonvolatile compounds to be removed from a reaction chamber during an etch process. In such a case, the method may include applying power to a microelectronic topography which is adapted to form a plurality of nonvolatile compounds with a plasma. In addition, the method may include reducing the power to a level sufficient to reduce a concentration of the nonvolatile compounds within the reaction chamber and successively repeating the steps of applying and reducing a plurality of times.

In some cases, the microelectronic topography etched using the method described herein may include a stack of layers used to form a magnetic junction of a magnetic random access memory (MRAM) device. As such, the method may, in some cases, include etching a magnetic layer of the magnetic junction. In addition or alternatively, the method may include etching a metal cap layer of the magnetic junction. Furthermore, the method may alternatively or additionally include etching a tunneling layer of the magnetic junction. In yet other embodiments, the method described herein may be used for patterning all of the layers of a magnetic junction. Consequently, a method for fabricating a magnetic junction of an MRAM device is contemplated herein. More specifically, a method is provided which includes pulsing a bias power applied to a microelectronic topography during a patterning process of a stack of layer such that a magnetic junction is formed with a periphery that is substantially absent of nonvolatile compounds. In any case, the patterning process may include using a photo resist mask or a hard mask layer to pattern the microelectronic topography. In addition, the method may include cleaning the microelectronic topography using a chemistry consisting essentially of deionized water in succession to the step of patterning the topography.

There may be several advantages to etching a microelectronic topography using the method described herein. In particular, a topography may be patterned without an accumulation of etch byproducts along its periphery using the method described herein. Consequently, a cleaning process which uses an acidic or basic chemistry may not be needed for the fabrication of the device. As a result, a patterned structure may be fabricated having dimensions within the design specifications of the device. In particular, a magnetic junction of an MRAM device may be fabricated with dimensions that comply with the design specifications of the device, such that the resistance of the junction is not undesirably large. In addition, the magnetic junction may be patterned without including veiling along the sidewalls of the junction. Consequently, shorts between the layers of the magnetic junction may be avoided.

BRIEF DESCRIPTION OF THE DRAWINGS

Other objects and advantages of the invention will become apparent upon reading the following detailed description and upon reference to the accompanying drawings in which.

Figure 1:
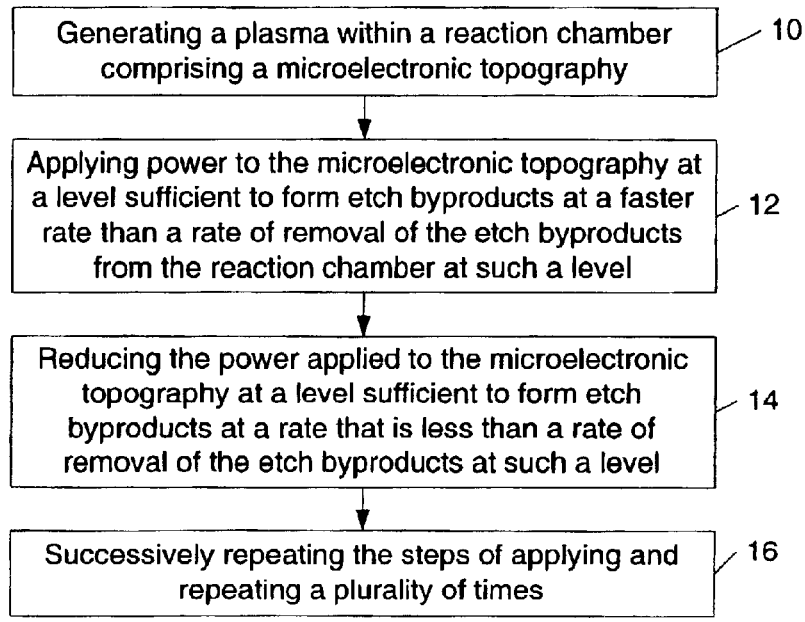
FIG. 1 depicts a flowchart outlining a method for etching a microelectronic topography.

While the invention may include various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning to the drawings, a flowchart of a method for etching a microelectronic topography is depicted in FIG. 1. In particular, FIG. 1 includes step 10 which includes generating a plasma within a reaction chamber comprising a microelectronic topography. The method further includes step 12 in which power is applied to the microelectronic topography at a level sufficient to form etch byproducts at a faster rate than a rate of removal of the etch byproducts from the reaction chamber at such a level. Moreover, the method may include step 14 in which the power applied to the microelectronic topography is reduced to a level sufficient to form etch byproducts at a rate that is less than a rate of removal of the etch byproducts at such a reduced power level. Such steps of applying and reducing may be successively repeated a plurality of times during the method as indicated by step 16 in FIG. 1 Consequently, the application of power to the microelectronic topography may be described to be "pulsed" or "time-modulated" during the etch process. In general, such a process of pulsing power to the microelectronic topography does not affect the compatibility of the type of mask layer used during the etch process. As such, the etch process described herein may be used with a photoresist mask or a hard mask layer, depending on the etch chemistry and/or the fabrication sequence of the device.

In general, the method described herein may be fabricated within any microelectronic device. In particular, the method may be used for etching topographies comprising semiconductor materials and/or magnetic materials. In some cases, it may be particularly advantageous to use the method in an embodiment in which the microelectronic topography and the plasma are adapted to form nonvolatile compounds as described in more detail below. For example, in some embodiments, it may be advantageous to use the method for patterning a magnetic junction of an MRAM device. In particular, using the method described herein may advantageously form a magnetic junction of an MRAM device that does not have a residue of nonvolatile compounds along the periphery of the junction.

Figure 2:
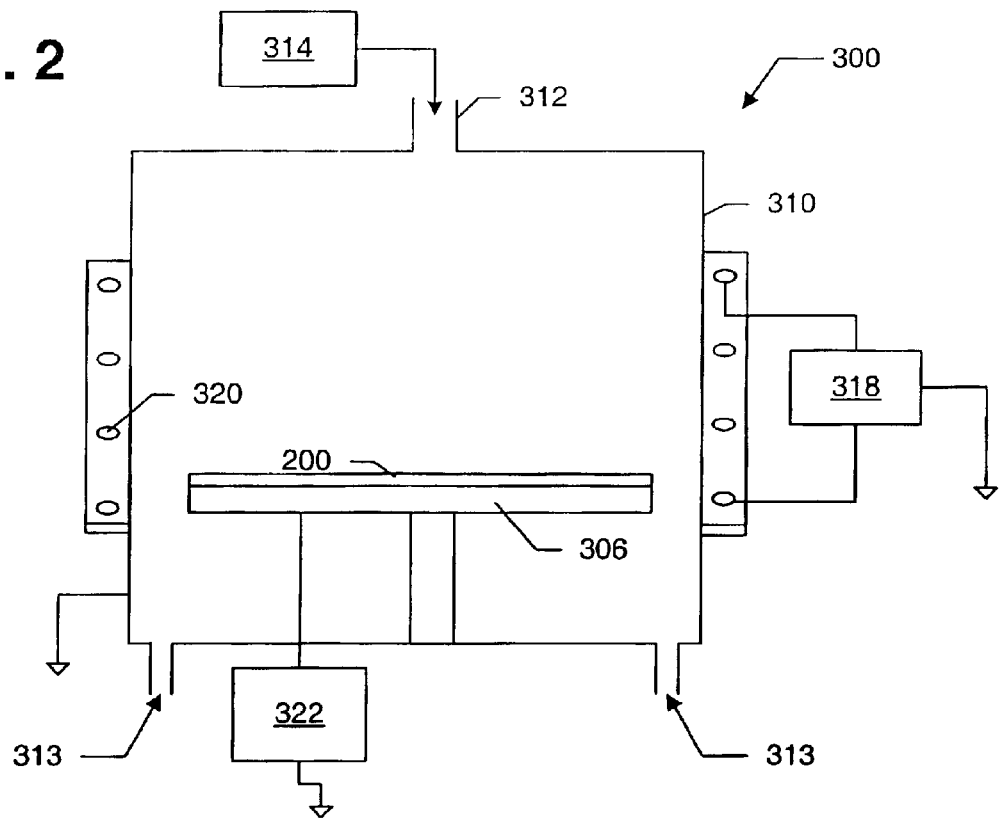
FIG. 2 depicts a cross-sectional view of an exemplary plasma reaction chamber.

The method is described in more detail with regard to the operations of the plasma reaction chamber illustrated in FIG. 2. As such, the method described herein, may include any of the limitations or adaptations described in reference to the operations of the plasma reaction chamber illustrated in FIG. 2. In general, FIG. 2 illustrates an exemplary cross-sectional view of chamber 300 including ionizing element 320, pedestal 306, gas inlet 312, and gas outlets 313. Such an illustration may be representative of, for example, a Metal Etch DPS™ system manufactured by Applied Materials, Inc. of Santa Clara, Calif. However, any reaction chamber which is adapted to generate a plasma may be used for the method described herein. Consequently, the method is not restricted to the use of the reaction chamber depicted in FIG. 2.

As shown in FIG. 2, chamber 300 may be coupled to gas supply 314, which supplies the gas from which a plasma may be generated within chamber 300. In general, gas supply 314 may include any gas or gas mixture, which is used in the integrated circuit fabrication industry for etching topographies. For example, gas supply 314 may include fluorinated carbons ($C_xF_y$, wherein $x \geq 2$ and $y \geq 6$), fluorinated hydrocarbons ($CH_xF_y$, wherein $x \geq 2$ and $y \geq 3$), sulfur hexafluoride ($SF_6$), nitrogen trifluoride ($NF_3$), chlorine ($Cl_2$), hydrogen chloride (HCl), hydrogen bromide (HBr), boron trichloride ($BCl_3$), hydrogen iodine (HI), or any combination of halogen compounds. In some embodiments, gas supply 314 may further include one or more inert gases to dilute the reactionary gases of gas supply 314. For example, gas supply 314 may include argon, xenon, and/or helium. In addition or alternatively, gas supply 314 may include gases which are adapted to control the density, uniformity, and/or etch profile of the microelectronic topography For example, gas supply 314 may include nitrogen, oxygen, hydrogen, and/or carbon oxide, in some embodiments.

In any case, gas supply 314 may be supplied to chamber 300 through gas inlet 312. In some cases, gas supply 314 may be supplied to chamber 300 through a plurality of gas inlets. In yet other embodiments, the method may include supplying one or more of the gases used to create the plasma within chamber 300 through separate gas inlets. In any case, the flow rate of the gas into chamber 300 may vary depending on design specifications of the device and/or the process parameters of the etch process. In general, however, the flow rate of the gas from gas supply 314 into chamber 300 may be between approximately 5.0 standard cubic centimeters per minute (sccm) and approximately 50 sccm, more preferably between approximately 15 sccm and approximately 25 sccm. As shown in FIG. 2, chamber 300 may further include gas outlets 313 with which to release exhaust gases from the etch process. Gas outlets 313 may be connected to a pumping system (not shown) including one or more vacuum pumps. In general, the pumping system may be adapted to maintain a desired level of pressure with the chamber. For example, the vacuum pumps may be configured to create a pressure between approximately 1 mTorr and approximately 2 Torr, or more specifically, between approximately 3 mTorr and approximately 30 mTorr within chamber 300. Larger or smaller levels of pressure may be created within chamber 300, depending on the process parameters of the etch process. It is noted that although two gas outlets are shown in FIG. 2, any number of gas outlets may be arranged within chamber 300.

In general, pedestal 306 may be adapted for supporting and retaining microelectronic topography 200 during processing. In some cases, pedestal 306 may be moveable such that the distance between microelectronic topography 200 and gas inlet 312 may be adjusted. In particular, pedestal 306 may be configured as an electrostatic or mechanical chuck. In either case, the distance between microelectronic topography 200 and gas inlet 312 may depend on the design specifications of the device being etched and the process parameters of the etch process. In yet other embodiments, pedestal 306 may be a fixed platform. In either embodiment, pedestal 306 may be adapted to control the temperature of the topography during the deposition process. For example, pedestal 306 may be adapted to maintain a temperature between approximately 20° C. and approximately 200° C. In particular, pedestal 306 may, in some embodiments, include a means for heating and/or cooling microelectronic topography 200.

As shown in FIG. 2, ionizing element 320 may be arranged exterior to the chamber walls of chamber 300. More preferably, ionizing element 320 may include an induction coil mounted near or on sidewalls 310 of the chamber. The induction coil may turn around the chamber any number of times. Preferably, ionizing element 320 may be adapted to ionize at least a portion of the gas atoms within chamber 300. In particular, ionizing element 320 may be coupled to power supply 318, such that a plasma within chamber 300 may be formed. In general, power supply 318 may include any energy source, such as DC power supply sources, AC power supply sources, radio frequency (RF) power sources, and/or microwave sources. In any case, the power applied to ionizing element 320 may be less than approximately 2.5 kW. More specifically, the power applied to ionizing element 320 may be between approximately 1.0 kW and approximately 2.0 kW, more preferably about 1.5 kW.

In some cases, such an ionization of gas atoms may produce a high density plasma within chamber 300. A "high density plasma," as used herein, may refer to a plasma having an electron density greater than approximately $1.0 \times 10^{12}$ $cm^{-3}$. However, it is noted that the method described herein is not restricted to the use of high density plasmas. On the contrary, the method described herein may be conducted with the use of low, medium, or high density plasmas. A "medium density plasma," as used herein, may refer to a plasma having an electron density between approximately $1.0 \times 10^8$ $cm^{-3}$ and approximately $1.0 \times 10^{12}$ $cm^{-3}$, while a "low density plasma" may refer to a plasma having an electron density less than approximately $1.0 \times 10^8$ cm$^{-3}$. In any case, the generation of the plasma is preferably induced prior to the pulsing of the power applied to microelectronic topography 200 as described in more detail below. In particular, it may be beneficial to apply power to ionizing element for a brief period of time prior to pulsing the power applied to microelectronic topography 200 such that a plasma may be initialized within chamber 300. In general, such an initialization period may be less than approximately 5 seconds.

In any case, once a plasma is formed within chamber 300, a high electric field, or plasma sheath, may develop between the plasma and microelectronic topography 200. In general, the plasma sheath may serve as a channel through which to accelerate and collimate ions toward the surface of microelectronic topography 200 from the plasma. In some cases, however, the ions within the plasma sheath may not be projected in a substantially uniform manner. As a result, ions within the plasma sheath may bombard microelectronic topography 200 at a variety of angles, inhibiting an anisotropic etch profile from being obtained. In yet other cases, the strength of the plasma sheath may not be sufficient to etch microelectronic topography 200. In other words, the ions within the plasma sheath may not move with enough speed or force with which to bombard microelectronic topography 200. Therefore, in some cases, the directionality and the energy of the ions within the plasma sheath may need to be increased for an etch process.

One manner with which to increase the strength of a plasma sheath is to apply power to microelectronic topography 200 such that the plasma is biased toward the topography. As a result, the ion density within the plasma sheath may be increased. In general, an increase in ion density in a given area will cause an increase of ion energy within the area. Consequently, the rate and force of ions bombarding microelectronic topography 200 will increase with an increase in the application of power to the topography. In this manner, the etch rate of the etch process may be regulated by the bias power applied to microelectronic topography 200. In general, the etch rate of the process described herein may be between approximately 20 angstroms/minute and approximately 300 angstroms/minute. Larger or smaller etch rates may be regulated by the application of the bias power, depending on the parameters of the etch process. In any case, biasing the plasma toward microelectronic topography 200 will also control the directionality of the ions within the plasma sheath. In particular, applying a bias power to microelectronic topography 200 will draw a higher percentage of ions in a perpendicular direction with respect to the topography. In this manner, an etch process may yield an anisotropic etch profile using a bias power application to microelectronic topography 200.

As shown in FIG. 2, power supply 322 may be operably coupled to pedestal 306. In general, power supply 322 may include any energy source, such as a DC power supply source, an AC power supply source, a RF power source, and/or a microwave power source. In any case, power supply 322 may be adapted to pulse between high and low levels of power such that the strength of the plasma sheath may be altered during the etch process. More specifically, power supply 322 may be adapted to oscillate between high and low levels of power such that the strength of the plasma sheath may alternate between high and low levels of ion energy. For example, power supply 322 may be adapted to oscillate between high and low levels of power which are sufficient to generate ion energies greater than approximately 150 eV and less than approximately 100 eV, respectively. In general, larger or smaller ion density values may be induced by the high and low power levels supplied from power supply 322, depending on the design specifications of the device. For example, in some cases, the low level of power may produce an ion energy less than approximately 50 eV or, more specifically, less than approximately 20 eV. On the other hand, the high level of power may additionally or alternatively produce an ion energy greater than approximately 200 eV.

In any case, the high power level is at least sufficient to etch microelectronic topography 200. More specifically, the high power level is at least sufficient to generate an ion density within the plasma sheath such that the ions bombard microelectronic topography 200 to etch away some of the topography. For example, the high power level may be between approximately 25 W and approximately 300 W, or more preferably at about 100 W. The low power level, on the other hand, may be less than the high level power. For example, in some embodiments, the low power level may be less than approximately 25 W or, more specifically, less than approximately 5 W. Larger or smaller power levels, however, may be used for the high and low power levels pulsed by power supply 322. For example, in some cases, the low power level may be a state in which no power is applied at all. In such a case, pulsing power supply 322 may include oscillating between on and off states of the power supply. Alternatively, pulsing power supply 322 may include oscillating between high and low levels of an on state. In either case, the low level power may be sufficient to stop etching microelectronic topography 200 with the plasma in some embodiments. In yet other cases, the microelectronic topography 200 may be continued to be etched at the low power level, but at a slower etch rate as compared to the etch rate at the high power level.

In any case, the plasma etching process may form etch byproducts within chamber 300 which are preferably removed through gas outlets 313. In general, the etch byproducts may include compounds formed from the reaction of the plasma with the microelectronic topography. Consequently, the composition of the etch byproducts may depend on the etch chemistry and the material etched from the microelectronic topography. For example, the etch byproducts may include chlorinated, hydrogenated, fluorinated, or oxygenated compounds including silicon or metal molecules. For instance, materials which include nickel, cobalt, iron, platinum, or tungsten and that are etched using a chlorinated etch chemistry may generate etch byproducts comprising nickel chloride, cobalt chloride, iron chloride, platinum chloride, and tungsten chloride, respectively.

Since the power applied to microelectronic topography 200 affects the etch rate of the topography the bias power, in turn, affects the formation rate of the etch byproducts during the etch process. In particular, the generation of etch byproducts within the reaction chamber will be proportional to the power level applied to microelectronic topography. More specifically, a higher concentration of etch byproducts will be formed with power supply 322 pulsed at the high power level than power supply 322 pulsed at the low power level. In a preferred embodiment, the method described herein may be conducted such that the formation of etch byproducts at the high power level is greater than the removal rate of the etch byproducts from chamber 300 at such a power level. In addition, the method may conducted such that the formation of etch byproducts at the low power level is less than the removal rate of the etch byproducts from chamber 300 at such a power level. More specifically, the method may be conducted such that the low bias power level is sufficient to reduce the concentration of etch byproducts within the reaction chamber. In this manner, the topography may be etched without forming an accumulation of residue (i.e., etch byproducts) thereon. More specifically, the ion energy within the plasma sheath may be increased to a level at which etching the topography may be optimized while allowing time for the etch byproducts formed from such an etching process to be removed.

The removal of the etch byproducts from chamber 300 using the process of pulsing power applied to microelectronic topography 200 is believed to occur in a variety of manners. In particular, one manner in which the etch byproducts are believed to be removed from chamber 300 during the low level pulse bias is by a reduction in the concentration of the etch byproducts within the plasma and/or plasma sheath. It is postulated that at high levels of bias power, the ion energy within the plasma and plasma sheath may prevent some etch byproducts from being released. More specifically, the ions may be moving at such a high rate that the etch byproducts are trapped within the plasma and plasma sheath. As such, as time progresses, the plasma and plasma sheath may become saturated, causing the etch byproducts to dispense onto the topography. The method described herein, however, advantageously reduces the bias power supply to a low level momentarily such that the energy of ions within the plasma and the plasma sheath may be decreased. In this manner, a relatively high concentration of etch byproducts may be periodically flushed from the plasma and plasma sheath.

Another manner in which lowering the bias power may contribute to enhancing the removal of etch byproducts from chamber 300 relative to the formation of the etch byproducts, is the removal of etch byproducts arranged upon microelectronic topography 200. More specifically, the decrease in ion energy within the plasma sheath during the low power level bias may allow etch byproducts to be evaporated. Such a manner of removal may be particularly prevalent in an embodiment in which the etch byproducts include nonvolatile compounds, as described in more detail below. Furthermore and as stated above the reduction of bias power applied to microelectronic topography 200 may lessen the directionality of the ions within the plasma sheath, allowing the ions to be projected in a variety of directions. Such a projection of the ions may be sufficient to loosen any residue accumulated on microelectronic topography providing yet other manner in which to remove the etch byproducts formed within chamber 300 at the high bias power level.

Consequently, the operational parameters of pulsing the bias power may be optimized such that the topography is etched in a timely manner and is substantially absent of etch byproducts along its periphery. For example, the duty ratio of the pulsed bias power may be optimized. "Duty ratio," as used herein, may refer the amount of time at a high bias power level divided by the overall time used to pulse the bias power at both the high and low levels. As such, in some cases, duty ratio may be referenced as a percentage. For example, in some cases, the duty ratio of the pulsed bias power used in the method described herein may be between approximately 5% and approximately 90% or, more specifically, between approximately 25% and approximately 75%. Larger or smaller duty ratios, however, may be used, depending on the design specifications of the device and the parameters of the etch process. In particular, etch processes with relatively high duty ratios will etch a topography at a given depth in a shorter amount of time than an etch process with a relatively small duty ratio. However, an etch process with a relatively small duty ratio may be more likely to insure an adequate removal of the etch byproducts from chamber 300.

In any case, the modulation frequency of pulsing the bias power may also be optimized for the etch process. In particular, the modulation frequency of the bias power may be optimized to etch the topography in an efficient manner while insuring the topography is substantially absent of an accumulation of etch byproducts subsequent to the etch process. For example, the modulation frequency of pulsing the bias power may be between approximately 10 Hz and approximately 100 kHz or, more specifically, between approximately 100 Hz and approximately 1 kHz. Larger or smaller modulation frequencies, however, may be used for the method described herein, depending on the design specifications of the device and the parameters of the etch process. In particular, a relatively low modulation frequency may be more likely to insure to prevent the accumulation of etch byproducts upon the topography subsequent to the etch process, while a relatively high modulation frequency may allow the topography to be etched at a faster rate. "Modulation frequency," as used herein, may refer to the number of times power supply 322 pulses the power from the high level to the low level in a given period of time.

As mentioned above, the method described herein may be particularly advantageous in etch processes which form nonvolatile compounds. In particular, nonvolatile compounds may be less likely to be removed from a reaction chamber due to the relatively low volatility. Consequently, nonvolatile compounds may be more likely to accumulate upon surfaces of a microelectronic topography during a conventional etch process. In general, a nonvolatile compound, as used herein, may refer to a compound which has boiling point greater than approximately 300° C. at standard pressure. In some cases, the definition of a nonvolatile compound, as used herein, may be restricted to compounds which have a boiling point greater than approximately 900° C. at standard pressure. Examples of some nonvolatile compounds include, for instance, nickel chloride, cobalt chloride, iron chloride, and tungsten chloride.

As such, it may be particularly advantageous to use the method described herein in etching processes which pattern microelectronic topographies including nickel, cobalt, iron, and/or tungsten metals, since chlorinated gases are commonly used in plasma etch processes. For example, the method may be used in the etching process of a magnetic junction of a magnetic random access memory (MRAM) device. In fact, the method may be used for etching any or all of the layers of an MRAM magnetic junction. In particular, the method may be used for etching one or more magnetic layers of the MRAM magnetic junction, including but not limited to materials comprising nickel-iron, cobalt-iron, nickel-cobalt-iron, or platinum-iron. In addition or alternatively, the method may be used for etching a metal cap layer of the MRAM magnetic junction. In some cases, such a metal cap layer may include tantalum. In yet other cases, however, the metal cap layer may include a different type of metal, such as tungsten or titanium, for example. In some embodiments, the method may be used to etch the tunneling layer of the magnetic junction, such as aluminum oxide. In yet other embodiments, the method described herein may be used for patterning all of the layers of a magnetic junction. Consequently, a method for fabricating a magnetic junction of an MRAM device is contemplated herein. More specifically, a method is provided which includes pulsing a bias power applied to a microelectronic topography during a patterning process of a stack of layers such that a magnetic junction is formed with a periphery that is substantially absent of nonvolatile compounds.

In general, a microelectronic topography may be cleaned subsequent to an etch process. However, as described above, some conventional etch processes require the cleaning step to include an acidic or basic chemistry such that an accumulation of residue may be removed from the periphery of the patterned topography. The etch process described herein, however, prevents the accumulation of nonvolatile compounds along the periphery of a patterned topography. Therefore, a fabrication sequence including the etch process described herein may not need a clinking step which uses an acidic or basic chemistry. Such an omission of acidic or basic chemistry with which to clean the topography may advantageously allow a structure halving dimensions within the design specifications of the device to be maintained. In this manner, the process sequence described herein may fabricate an MRAM magnetic junction having dimensions within the design specifications of the device, thereby preventing the formation of a magnetic junction having too high of a resistance.

In some embodiments, the fabrication sequence described herein may include cleaning the microelectronic topography using a chemistry consisting essentially of deionized water in succession to the step of patterning the microelectronic topography. Such a cleaning step may advantageously remove water-soluble debris arranged upon the topography without further etching the layers of the topography. In general, the description of the cleaning step "in succession" to the step of patterning may refer to the sequence in which the steps are performed. More specifically, a cleaning step conducted "in succession" to the step of patterning may refer to the step that is performed subsequent to the step of patterning without having any other processing steps which affect the topography of the device occurring between the steps.

It will be appreciated to those skilled in the art having the benefit of this disclosure that this invention is believed to provide a method for etching a microelectronic topography. Further modifications and alternative embodiments of various aspects of the invention will be apparent to those skilled in the art in view of this description. For example, although the benefits of such the etch technique is specifically described in reference to the fabrication of microelectronic devices which form etch byproducts which include nonvolatile compounds, the method may be used for any etch process. In addition, although the deposition technique has been described in reference to using a coil to generate a plasma, other plasma generators, such as electron cyclotron resonance (ECR) generators may be used in the method described herein. Furthermore, the method may be used to etch any thickness of a material. It is intended that the following claims be interpreted to embrace all such modifications and changes and, accordingly, the specification and drawings arc to be regarded in an illustrative rather than a restrictive sense.

What is claimed is:

1. A method for etching a microelectronic topography within a plasma reaction chamber comprising pulsing power applied to the microelectronic topography between a high level and a low level, wherein the high level is sufficient to form etch byproducts at a faster rate than a rate of removal of the etch byproducts from the plasma reaction chamber at the high level, and wherein the low level is sufficient to form etch byproducts at a rate that is less than a rate of removal of the etch byproducts at the low level.

2. The method of claim 1, wherein the etch byproducts comprise a plurality of nonvolatile compounds, and wherein the step of pulsing comprises forming an etched microelectronic topography which is substantially absent of the nonvolatile compounds.

3. The method of claim 1, wherein the step of pulsing comprises oscillating the power between on and off states.

4. The method of claim 1, wherein the step of pulsing comprises oscillating the power between different levels of an on state.

5. The method of claim 1, further comprising generating a plasma above the microelectronic topography, wherein the high level is sufficient to generate an ion energy greater than approximately 150 eV between the plasma and the microelectronic topography, and wherein the low level is sufficient to generate an ion energy less than approximately 100 eV between the plasma and the microelectronic topography.

6. The method of claim 1, further comprising applying contiguous supply of power to an induction coil of the plasma reaction chamber to prior to the step of pulsing the power applied to the microelectronic topography such that a plasma may be initialized within the reaction chamber.

7. A method for processing a microelectronic topography, comprising:

generating a plasma within a reaction chamber comprising the microelectronic topography;

applying power to the microelectronic topography at a first level sufficient to etch the microelectronic topography with the plasma, wherein the plasma and microelectronic topography are adapted to form a plurality of nonvolatile compounds within the reaction chamber during the etch process;

reducing the power to a second level sufficient to reduce a concentration of the nonvolatile compounds within the reaction chamber; and successively repeating the steps of applying and reducing a plurality of times.

8. The method of claim 7, wherein the step of reducing the power to the second level is sufficient to prevent in accumulation of the nonvolatile compounds upon the microelectronic topography.

9. The method of claim 7, wherein the step of reducing the power to the second level is sufficient to remove an accumulation of the nonvolatile compounds upon the microelectronic topography.

10. The method of claim 7, wherein the step of reducing comprises reducing the power to a level sufficient to substantially stop etching the microelectronic topography with the plasma.

11. The method of claim 7, wherein the step of applying comprises etching a magnetic layer of the microelectronic topography with the plasma.

12. The method of claim 7, wherein microelectronic topography comprises a stack of layers used to form a magnetic junction of a magnetic random access memory device.

13. The method of claim 12, wherein the step or applying comprises etching a metal cap layer of the magnetic junction with the plasma.

14. The method of claim 12, wherein the step of applying comprises etching a tunneling layer of the magnetic junction with the plasma.

15. The method of claim 7, wherein the step of generating a high density plasma.

16. The method for forming a magnetic junction of an magnetic random access memory device, comprising:

patterning a stack of layers of a microelectronic topography to form the magnetic junction; and pulsing power applied to the microelectronic topography during the step of patterning such that the periphery of the magnetic junction is substantially absent of non-volatile compounds.

17. The method of claim 16, wherein the step of pulsing comprises a modulation frequency between approximately 10 Hz and approximately 100 KHz.

18. The method of claim 16, wherein the step pulsing comprises a duty percentage between approximately 10% and approximately 90%.

19. Th method of claim 16, wherein the step of patterning comprises using a photo resist mask to pattern the stack of layers.

20. The method of claim 16, wherein the step of patterning comprises using a hard mask layer to pattern the stack of layers.

21. The method of claim 16, further comprising cleaning the microelectronic topography using a chemistry consisting essentially of deionized water in succession to the step of patterning the stack of layers.

* * * * *

UNITED STATES PATENT AND TRADEMARK OFFICE
CERTIFICATE OF CORRECTION

PATENT NO. : 6,759,339 B1
DATED : July 6, 2004
INVENTOR(S) : Choi et al.

It is certified that error appears in the above-identified patent and that said Letters Patent is hereby corrected as shown below:

Title page,
Item [74], Inventors, please delete "Mollie E. Lettung" and substitute therefor -- Mollie E. Lettang --.

Column 12,
Line 19, please delete "contiguous" and substitute therefor -- continuous --.
Line 22, please delete "the reaction" and substitute therefor -- the plasma reaction --.
Line 66, please delete "The method," and substitute therefor -- A method --.

Column 13,
Line 10, please delete "step pulsing" and substitue therefor -- step of pulsing --.

Column 14,
Line 1, please delete "Th method" and substitute therefor -- The method --.

Signed and Sealed this

Twenty-first day of December, 2004

JON W. DUDAS
*Director of the United States Patent and Trademark Office*